(12) United States Patent
Masuyama

(10) Patent No.: US 6,674,471 B1
(45) Date of Patent: Jan. 6, 2004

(54) SOLID-STATE IMAGING DEVICE AND METHOD FOR DRIVING THE SAME

(75) Inventor: Masayuki Masuyama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/321,581

(22) Filed: May 28, 1999

(30) Foreign Application Priority Data

Jun. 5, 1998 (JP) ............................................. 10-156982

(51) Int. Cl.$^7$ .......................... H04N 3/14; H04N 5/335; H01L 27/148; H01L 29/768; H03K 17/62
(52) U.S. Cl. ...................... 348/312; 348/294; 348/302; 257/223; 257/229; 257/230; 327/407
(58) Field of Search ................................ 348/294, 312, 348/302; 257/223, 229, 230; 327/407; 250/208.1

(56) References Cited

U.S. PATENT DOCUMENTS

| | | | |
|---|---|---|---|
| 4,908,684 A | | 3/1990 | Koike et al. |
| 5,280,202 A | * | 1/1994 | Chan et al. ..................... 326/37 |
| 5,907,357 A | * | 5/1999 | Maki ........................... 348/312 |
| 5,933,188 A | * | 8/1999 | Shinohara et al. ........... 348/302 |
| 6,002,123 A | * | 12/1999 | Suzuki ....................... 250/208.1 |
| 6,008,486 A | * | 12/1999 | Stam et al. ............... 250/208.1 |
| 6,452,633 B1 | * | 9/2002 | Merrill et al. ............... 348/302 |

* cited by examiner

Primary Examiner—Andrew Christensen
Assistant Examiner—Brian Genco
(74) Attorney, Agent, or Firm—McDermott, Will & Emery

(57) ABSTRACT

A solid-state imaging device includes an imaging area including a plurality of pixels arranged in columns and rows, and peripheral circuitry for selecting at least one of the pixels. Each said pixel includes: a photoelectric transducer for creating electric charges by photoelectric conversion and storing the charges therein; means for storing the charges read out from the photoelectric transducer; a transfer electrode, provided between the photoelectric transducer and the storage means, for reading out the charges from the photoelectric transducer to the storage means; an amplifier for sensing a variation in potential in the storage means; and a reset electrode for discharging the charges, stored in the storage means, to a power supply, thereby resetting the potential in the storage means. The peripheral circuitry includes a selector for generating first and second control signals, which are applied to the transfer and reset electrodes, respectively, to control the heights of first and second electrical barriers under the transfer and reset electrodes, respectively. The selector includes a bank of multi-stage inverters operative upon the application of first and second power supply voltages thereto. The second power supply voltage is lower than the first power supply voltage. Some of the inverters on the last stage generate biased output signals to be supplied as the first and second control signals.

17 Claims, 15 Drawing Sheets

TRi:OFF(Bias),
RSi:OFF(Bias)

output of row select encoder     buffer output of row select encoder — buffer

TRi:OFF,   Rsi:OFF

SOLID-STATE IMAGING DEVICE AND METHOD FOR DRIVING THE SAME

BACKGROUND OF THE INVENTION

The present invention relates to a solid-state imaging device and a method for driving the same.

In a solid-state imaging device, a plurality of photoelectric transducers, like photodiodes, are arranged in a matrix fashion in the imaging area thereof. Examples of solid-state imaging devices include not only charge-coupled device (CCD) types, but also metal-oxide-semiconductor (MOS) types. As in the CCD-type imaging devices, blooming is also caused in the MOS-type devices.

Hereinafter, blooming will be described in detail with reference to FIGS. 18A and 18B. FIG. 18A schematically illustrates a cross section of a single pixel portion of the imaging device, where photodiodes and transistors are formed, near the surface of a semiconductor substrate. FIG. 18B illustrates distribution of potentials in that part of the semiconductor substrate shown in FIG. 18A.

As shown in FIG. 18A, a photoelectric transducer 3 and respective gate electrodes of a transfer gate 4 and a reset transistor 7 are formed within the pixel. The photoelectric transducer 3 within the pixel shown in FIG. 18A is electrically isolated from a transistor section, including photoelectric transducer and detection portion, within an adjacent pixel (not shown) by an impurity doped layer (i.e., a channel stop region) with a dopant concentration higher than that in the substrate, LOCOS or the like. In the pixel with such a configuration, signal charges (electric carriers), which have been created by the photoelectric transducer 3 responsive to incoming light, are transferred through the transfer gate 4 into a detection portion 5 and then discharged to a power supply $V_{DD}$ via the reset transistor 7.

However, suppose intense light continues to enter the photoelectric transducer 3 even during an interval in which the transfer gate 4 and the reset transistor 7 should be OFF. In such a situation, charges with a quantity exceeding the maximum quantity storable in the photoelectric transducer 3 are sometimes created to overflow from the photoelectric transducer 3 as shown in FIG. 18B. As a result, the overflowing charges pass through the transfer gate 4 and the channel stop region to flow into the detection portion or the photoelectric transducer within the adjacent pixel. This is a phenomenon similar to a phenomenon called "blooming" in the field of CCD image sensors. As in CCD's, if blooming is caused in an amplifying solid-state imaging device, then some white band-like or circular patterns, deteriorating the quality thereof, are observed in an image captured. In order to suppress such blooming, solid-state imaging devices, including various types of overflow drain structures in respective imaging areas within respective semiconductor substrates, have been developed.

However, if an overflow drain structure is specially provided for an imaging area within a semiconductor substrate, then the manufacturing process of the device is adversely complicated or it becomes harder to downsize each photoelectric transducer. In addition, a control signal should be specially produced and applied to operate the overflow drain.

SUMMARY OF THE INVENTION

An object of the present invention is providing a solid-state imaging device that can suppress blooming with a simplified structure and a method for driving the same.

A solid-state imaging device according to the present invention includes an imaging area including a plurality of pixels arranged in columns and rows, and peripheral circuitry for selecting at least one of the pixels. Each said pixel includes: a photoelectric transducer for creating electric charges by converting incoming light into electric energy and for storing the charges therein; means for storing the charges that have been read out from the photoelectric transducer; a transfer electrode, provided between the photoelectric transducer and the storage means, for reading out the charges from the photoelectric transducer to the storage means; an amplifier for sensing a variation in potential in the storage means; and a reset electrode for discharging the charges, which have been stored in the storage means, to a power supply, thereby resetting the potential in the storage means. The peripheral circuitry includes a selector for generating first and second control signals. The first control signal is applied to the transfer electrode to control the height of a first electrical barrier under the transfer electrode, while the second control signal is applied to the reset electrode to control the height of a second electrical barrier under the reset electrode. The selector includes a bank of multi-stage inverters operative upon the application of first and second power supply voltages thereto. The second power supply voltage is lower than the first power supply voltage. Some of the inverters on the last stage generate biased output signals to be supplied as the first and second control signals.

Another solid-state imaging device according to the present invention includes: an imaging area including a plurality of pixels arranged in columns and rows; and peripheral circuitry for selecting at least one of the pixels. Each said pixel includes: a photoelectric transducer for creating electric charges by converting incoming light into electric energy and for storing the charges therein; an amplifier for sensing a variation in potential in the photoelectric transducer; and a reset electrode for discharging the charges, which have been stored in the photoelectric transducer, to a power supply, thereby resetting the potential in the photoelectric transducer. The peripheral circuitry includes a selector for generating a control signal to be applied to the reset electrode to control the height of an electrical barrier under the reset electrode. The selector includes a bank of multi-stage inverters operative upon the application of first and second power supply voltages thereto. The second power supply voltage is lower than the first power supply voltage. Some of the inverters on the last stage generate a biased output signal to be supplied as the control signal.

Still another solid-state imaging device according to the present invention includes a plurality of pixels and peripheral circuitry for selecting at least one of the pixels. Each said pixel includes information storage for storing therein electric charges created by photoelectric conversion, and a reset device, responsive to a control signal, for varying the height of an electrical barrier existing between the information storage and a power supply, thereby discharging the electric charges, which have been stored in the information storage, to the power supply. The peripheral circuitry includes a selector for generating the control signal. The selector includes a bank of multi-stage inverters operative upon the application of first and second power supply voltages thereto. The second power supply voltage is lower than the first power supply voltage. Some of the inverters on the last stage generate a biased output to be supplied as the control signal to the reset device.

A method according to the present invention is adapted to drive an embodiment of the solid-state imaging device according to the present invention. The method includes the steps of: creating electric charges by photoelectric conversion to store the charges in the information storage; and increasing a level of the control signal, generated by the selector, like pulses to make the reset device reset the charges in the information storage.

Another method according to the present invention is adapted to drive another embodiment of the solid-state imaging device according to the present invention. The method includes the steps of: creating electric charges by photoelectric conversion to store the charges in the photoelectric transducer; increasing a level of the first control signal, generated by the selector, like pulses to make the reset device reset the charges existing between the transfer electrode and the reset device; and increasing a level of the second control signal, generated by the selector, like pulses to transfer the charges in the photoelectric transducer to between the transfer electrode and the reset device via the transfer electrode.

According to the present invention, an excessive quantity of charges, which have been created in a photoelectric transducer, can be discharged toward a first power supply $V_{DD}$ via a reset transistor, for example. As a result, the overflow of charges within a pixel into an adjacent pixel can be prevented or at least drastically reduced, thus suppressing the generation of blooming.

DESCRIPTION OF THE PREFERRED EMBODIMENTS

Hereinafter, preferred embodiments of the present invention will be described with reference t,o the accompanying drawings.

Figure 1:
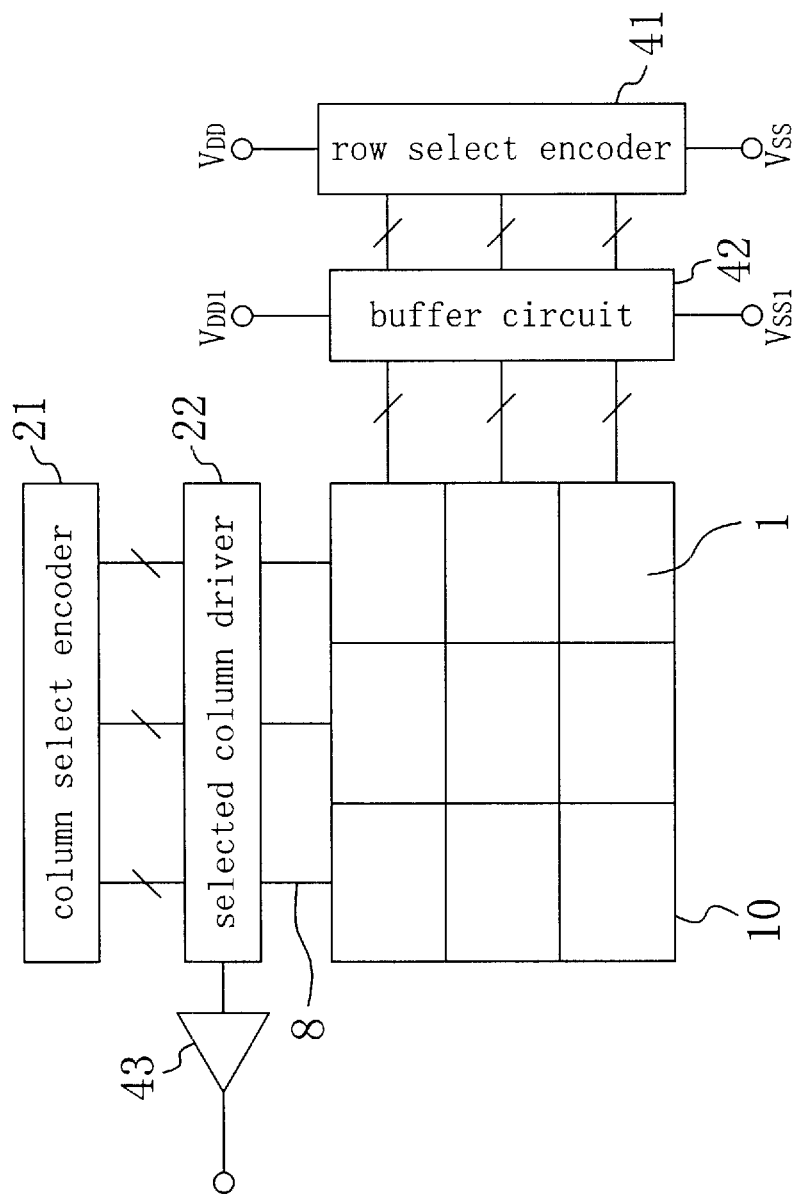
FIG. 1 is a block diagram schematically illustrating a configuration of a solid-state imaging device according to the present invention.

FIG. 1 is block diagram schematically illustrating a configuration of a solid-state imaging device according to the present invention.

The device includes: an imaging area 10 where a plurality of pixels 1 are arranged in columns and rows; and peripheral circuitry provided outside of the imaging area 10. The imaging area 10 and the peripheral circuitry are formed within a region of a semiconductor (e.g., single crystalline silicon) substrate by similar techniques to those applicable to the fabrication of a semiconductor integrated circuit. In FIG. 1, a 3×3 matrix of pixels 1 is illustrated for the sake of simplicity. However, in actuality, a much larger number of pixels on the order of several tens to several thousands are arranged on each row or column.

Figure 2:
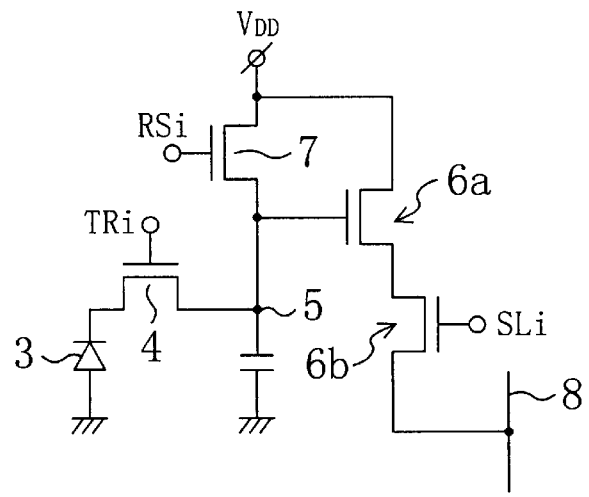
FIG. 2 is a circuit diagram illustrating an internal configuration of each pixel in a solid-state imaging device according to an exemplary embodiment of the present invention.

As shown in FIG. 2, each pixel 1 includes: a photoelectric transducer 3; a detection portion 5; and a transfer gate 4 provided between the photoelectric transducer 3 and the detection portion 5. The photoelectric transducer 3 converts incoming light into electric charges (electric carriers) and stores the created charges therein. The detection portion 5 can receive these carriers from the photoelectric transducer 3. And the transfer gate 4 turns ON/OFF responsive to a predetermined control signal. The photoelectric transducer 3 may be implemented as a photodiode, for example, for creating electric charges at a quantity corresponding to that of the light falling thereon. When the transfer gate 4 turns ON, the charges, or carriers, which have been created and stored within the photoelectric transducer 3, starts to move toward the detection portion 5 via the transfer gate 4. In accordance with the quantity of the charges received, the potential in the detection portion 5 changes from a first potential level (initial potential level) into a second potential level. The detection portion 5 has some parasitic capacitance or a capacitor, having a capacitance larger than the parasitic capacitance, is specially added to the detection portion 5. Accordingly, a capacitance is illustrated in FIG. 2. Because of the existence of this capacitance, the detection portion 5 can hold the received charges for a required period of time even after the transfer gate has turned OFF again.

Each pixel 1 further includes an MOS transistor 6a, functioning as an amplifier for sensing a variation in potential in the detection portion 5. The gate electrode of the MOS transistor 6a is connected to the detection portion 5. The drain of the transistor 6a is connected to a first power supply $V_{DD}$. And the source of the transistor 6a is connected to a vertical signal output line 8 via a switching transistor 6b within the pixel. The current drivability of the MOS transistor 6a is dependent on a potential at the gate electrode thereof, i.e., the potential in the detection portion 5. Responsive to a control signal SLi received at the gate electrode thereof, the switching transistor 6b turns ON/OFF. While the switching transistor 6b is ON, current flows from the first power supply $V_{DD}$ into a load element (e.g., a load resistor (not shown)) via the MOS transistor 6a, the switching transistor 6b and the vertical signal output line 8. In this embodiment, a source follower circuit is made up of the MOS transistor 6a and the load element. Accordingly, a signal potential with a level corresponding to the potential in the detection portion 5 appears on the vertical signal output line 8. And a signal with this potential is output as a pixel signal by a selected column driver 22 (see FIG. 1).

Each pixel 1 further includes a reset transistor 7 between the first power supply $V_{DD}$ and the detection portion 5. Responsive to a reset signal received at the gate electrode thereof, the reset transistor 7 compellingly resets the potential in the detection portion 5 at the potential level of the first power supply $V_{DD}$ or the vicinity thereof. When the reset transistor 7 turns ON, the charges, which have been stored in the detection portion 5, start to flow toward the first power supply $V_{DD}$ via the reset transistor 7. As a result, the potential in the detection portion 5 is compellingly reset at the initial level thereof.

Referring back to FIG. 1, the peripheral circuitry provided around the imaging area 10 includes: a row select encoder 41; a buffer circuit 42; a column select encoder 21; and the selected column driver 22. The row select encoder 41 operates to select an arbitrary one of the rows. An ordinary row selector such as this row select encoder 41 or a row-select shift register includes numerous banks of multi-stage inverters, of which the last-stage inverters are implemented as transistors with high current drivability. In this embodiment, since these inverters on the last stage perform a characteristic function, this group of last-stage inverters are extracted and illustrated as the buffer circuit 42. The column select encoder 21 operates to select an arbitrary one of the columns. The selected column driver 22 includes a switching device for electrically connecting a particular vertical signal output line 8 to the same horizontal signal output line.

In this embodiment, a known circuit configuration is applicable to a column selector.

Next, the operations of respective transistors included within a selected pixel and the flow of charges will be described with reference to FIGS. 3, 4, 5, 6 and 7. FIGS. 3 through 7 schematically illustrate charges and potentials in the vicinity of the surface of a semiconductor substrate on which photodiodes and transistors are formed within a pixel. In these drawings, the gate electrode of the reset transistor 7 (i.e., a reset gate) is identified by 7'. In this case, the source of the reset transistor 7 serves as the detection portion 5, and the drain of the reset transistor 7 is connected to the power supply $V_{DD}$.

Figure 3:
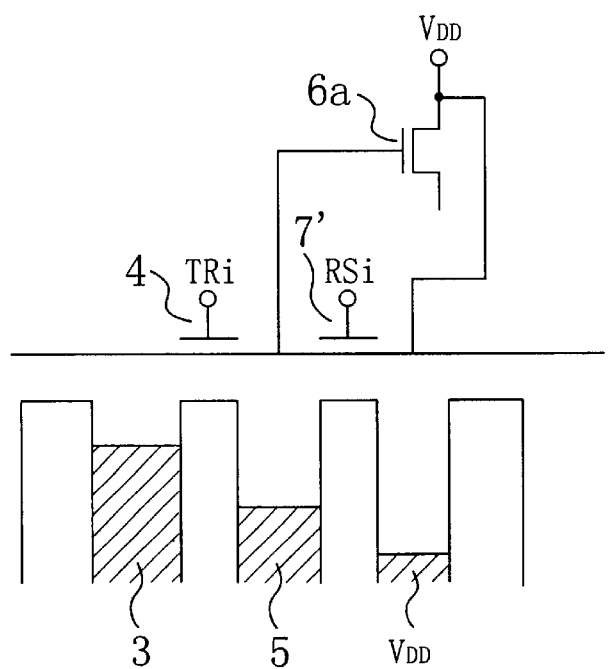
FIG. 3 schematically illustrates surface potentials and stored charges in a particular area within each pixel in a charge storage mode.

First, a charge storage mode, in which signal charges are being stored in the photoelectric transducer 3, will be described. In this mode, the transfer gate 4 and the reset transistor 7 are both OFF as shown in FIG. 3. Accordingly, the charges in the photoelectric transducer 3 are independent of the detection portion 5.

Figure 4:
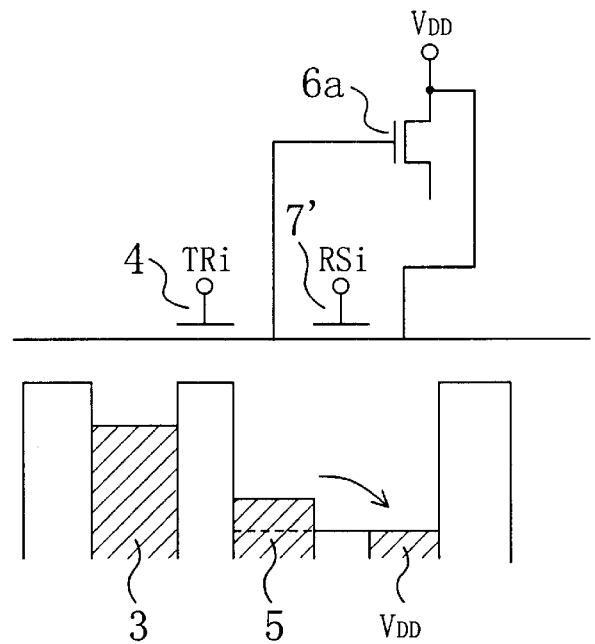
FIG. 4 schematically illustrates surface potentials and stored charges in the particular area within each pixel in a detection portion reset mode.

Next, a reset mode, in which the potential in the detection portion 5 is reset, will be described. As shown in FIG. 4, the transfer gate 4 is OFF, whereas the reset transistor 7 is ON. Thus, the charges in the detection portion 5 flow into the first power supply $V_{DD}$ while the charges in the photoelectric transducer 3 are still held therein. As a result, the potential in the detection portion 5 is compellingly reset at the "first potential state" determined by the first power supply $V_{DD}$.

Figure 5:
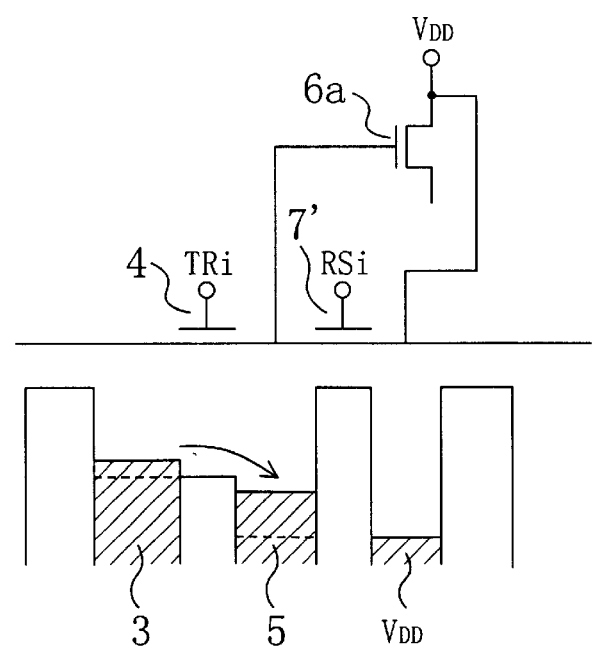
FIG. 5 schematically illustrates surface potentials and stored charges in the particular area within each pixel in a signal readout mode.

Next, a signal readout mode will be described. As shown in FIG. 5, the transfer gate 4 turns ON, whereas the reset transistor 7 returns to the OFF state. Accordingly, part or all of the signal charges created and stored in the photoelectric transducer 3 move into the detection portion 5. The quantity of the charges moving from the photoelectric transducer 3 into the detection portion 5 is dependent on the quantity of charges that have been stored in the photoelectric transducer 3 until just before the signal, readout and a channel potential at the transfer gate 4 in the ON state. The charges, which have moved into the detection portion 5, vary the potential at the gate electrode of the reset transistor 7.

Figure 6:
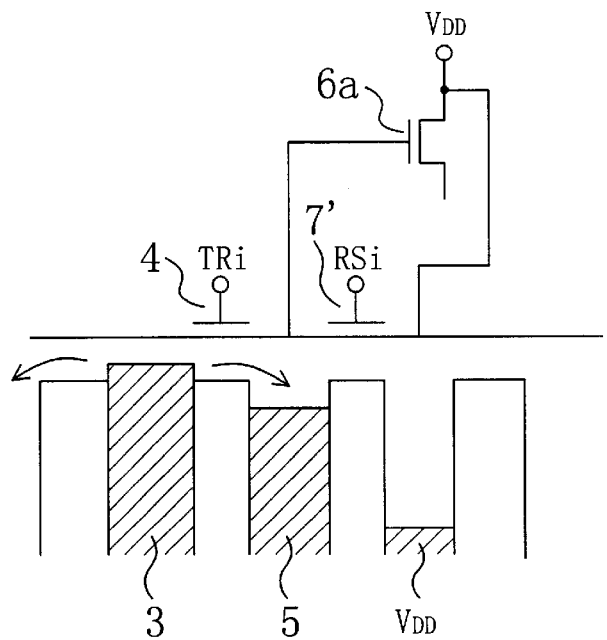
FIG. 6 schematically illustrates surface potentials and stored charges in the particular area within each pixel where blooming has been caused.

Next, the blooming phenomenon described above will be detailed. As shown in FIG. 6, the transfer gate 4 and the reset transistor 7 are both OFF. However, if an excessive quantity of charges have been created in the photoelectric transducer 3, part of the charges flow into the detection portion 5 via the transfer gate 4 in the OFF state, or go beyond the pixel isolating region into the detection portion or photoelectric transducer within an adjacent pixel. The charges overflowing in the adjacent pixel cause blooming.

In contrast, in the solid-state imaging device according to the present invention, the control signals, applied to the gate electrodes of the transfer gate 4 and the reset transistor 7, respectively, are biased. In this manner, the channel potentials (surface potentials) at the transfer gate 4 and the reset transistor 7 are decreased down to respective levels lower than that in the pixel isolating region even while the transfer gate 4 and the reset transistor 7 should be OFF. As a result, it is possible to prevent or at least suppress the overflow of excessive charges, created within the photoelectric transducer 3, into an adjacent pixel.

EMBODIMENT 1

Figure 8A:
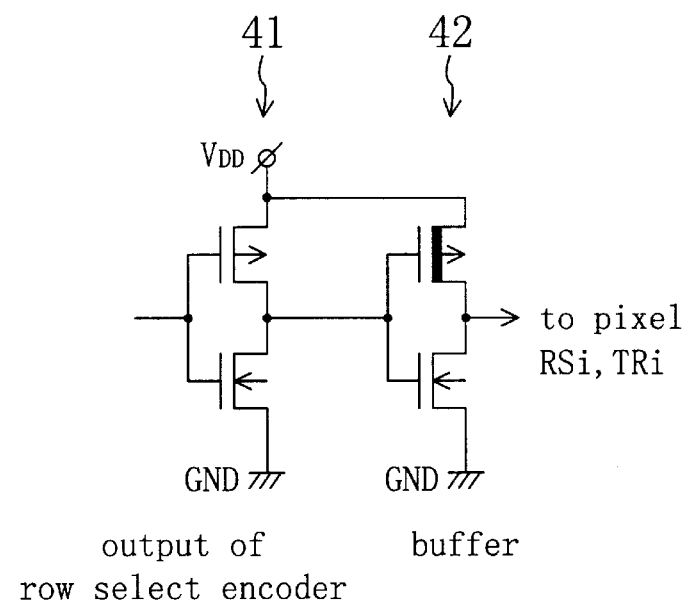
FIG. 8A is a circuit diagram illustrating a principal section, associated with the selection of an $i^{th}$ row, of a row selector in a solid-state imaging device according to a first embodiment of the present invention.
Figure 8B:
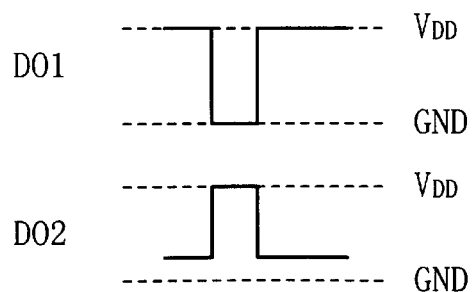
FIG. 8B is a waveform chart illustrating a signal DO1 input from an $(x+1)^{th}$-stage inverter to the input of a buffer in the row selector and a signal DO2 output through the output of the buffer.

Hereinafter, a solid-state imaging device according to a first embodiment of the present invention will be described with reference to FIGS. 8A and 8B. FIG. 8A illustrates a configuration of a principal section, associated with the selection of an $i^{th}$ row, of the row selector, where i is an arbitrary integer in the range from 1 to N, both inclusive, and N is an integer equal to or larger than 2. For convenience, the row selector is placed in FIG. 8A on the left of the imaging area 10 as opposed to the positional relationship shown in FIG. 1. In this specification, the inverters on the last stage (i.e., the $(x+2)^{th}$ stage) among the banks of multi-stage inverters included in the row selector will be called "buffers" to be distinguished from the other inverters on the other preceding stages (i.e., from first to $(x+1)^{th}$ stages, where x is an integer equal to or larger than 0).

Each of these buffers includes a p-channel MOS transistor and an n-channel MOS transistor. The respective gate electrodes of the p- and n-channel MOS transistors are connected together to function as the input of the buffer. In addition, the respective drains of the p- and n-channel MOS transistors are also connected together to function as the output of the buffer. Through the output of the buffer, required control signals are supplied to respective pixels included on an associated row in the imaging area 10.

Each $(x+1)^{th}$-stage inverter also includes a p-channel MOS transistor and an n-channel MOS transistor. The respective gate electrodes of the p- and n-channel MOS transistors are connected together to function as the input of the $(x+1)^{th}$-stage inverter. Also, the drain of the p-channel MOS transistor is connected to the drain of the n-channel MOS transistor to function as the output of the $(X+1)^{th}$-stage inverter. The output of the $(x+1)^{th}$-stage inverter is connected to the input of the buffer belonging to the same row. These basic configurations are employed in the other embodiments of the present invention described later, too. In this specification, an input signal supplied to the input of a buffer is identified by DO1 and an output signal outgoing through the output of the buffer is identified by DO2. Also, potentials applied to respective sources of the p- and n-channel MOS transistors of a buffer are identified by $V_{DD1}$ and $V_{SS1}$, respectively. Furthermore, potentials applied to p- and n-channel MOS transistors of an inverter preceding the buffer are identified by $V_{DD}$ and $V_{SS}$, respectively.

In this embodiment, the p-channel MOS transistor of a buffer operates in a depletion mode (e.g., the threshold voltage Vtp thereof is in the range from 1 to 0 volts), while the n-channel MOS transistor of the buffer, as well as the other MOS transistors, operates in an enhancement mode. Also, in this embodiment, it is supposed that $V_{DD1}=V_{DD}=$ 3.3 volts and $V_{SS1}=V_{SS}=$GND (ground level).

Figure 7:
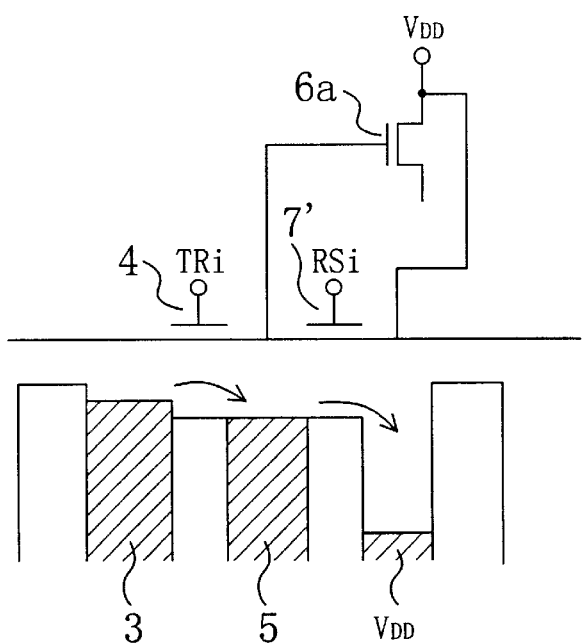
FIG. 7 schematically illustrates surface potentials and stored charges in the particular area within each pixel where blooming is suppressed.

The p-channel MOS transistor of each buffer operates in the depletion mode. Thus, even if an input signal with such a level as turning the p-channel MOS transistor OFF has been applied to the input of the buffer, a certain amount (on the order of several hundreds microamperes to several tens milliamperes) of current continues to flow through the p-channel MOS transistor. Accordingly, if an input signal DO1 shown in FIG. 8B has been applied from the output of the $(x+1)^{th}$-stage inverter to the input of the buffer, then an output signal DO2 with an amplitude between $V_{DD}$ and a level higher than GND appears at the output of the buffer. In this embodiment, such an output signal DO2 is transmitted as one of the control signals from each buffer to the transfer gate 4 and the reset transistor 7 within a pixel associated with the buffer. As a result, potentials such as those shown in FIG. 7 are formed on the surface of the semiconductor substrate even in the charge storage mode, whereby blooming can be suppressed.

In order to operate only the p-channel MOS transistor of the buffer in the depletion mode, a transistor with a buried structure may be formed as the p-channel MOS transistor, or the channel region of the p-channel MOS transistor may be selectively doped with an appropriate dopant.

EMBODIMENT 2

Figure 9A:
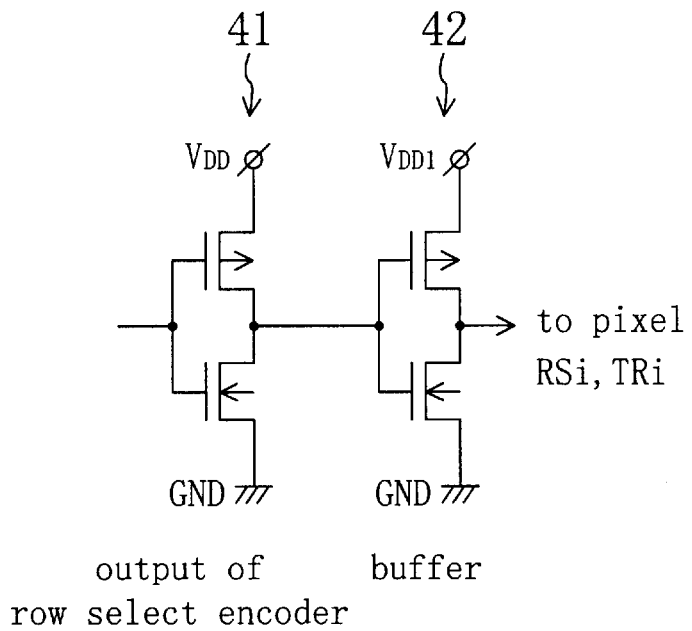
FIG. 9A is a circuit diagram illustrating a principal section, associated with the selection of the $i^{th}$ row, of a row selector in a solid-state imaging device according to a second embodiment of the present invention.
Figure 9B:
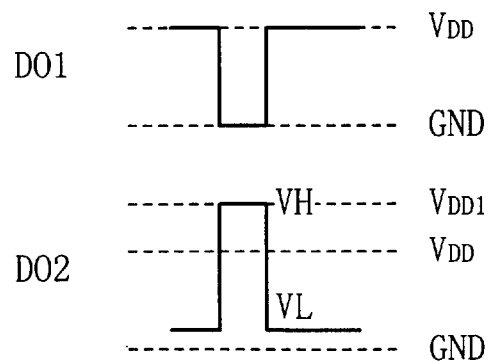
FIG. 9B is a waveform chart illustrating a signal DO1 input from the $(x+1)^{th}$-stage inverter to the input of a buffer in the row selector and a signal DO2 output through the output of the buffer.

Next, a solid-state imaging device according to a second embodiment of the present invention will be described with reference to FIGS. 9A and 9B. FIG. 9A illustrates a configuration of a principal section, associated with the selection of an $i^{th}$ row, of the row selector, where i is an arbitrary integer in the range from 1 to N, both inclusive, and N is an integer equal to or larger than 2.

In this embodiment, each buffer also includes a p-channel MOS transistor and an n-channel MOS transistor. The respective gate electrodes of the p- and n-channel MOS transistors are connected together to function as the input of the buffer. The respective drains of the p- and n-channel MOS transistors are also connected together to function as the output of the buffer. Through the output of each buffer, required control signals are supplied to respective pixels included on an associated row in the imaging area 10. Each $(x+1)^{th}$-stage inverter has the same configuration as that described in the first embodiment.

In this embodiment, the p-channel MOS transistor of each buffer, as well as the other MOS transistors, operates in an enhancement mode. This embodiment is characterized in that the relationships $V_{DD1}>V_{DD}$ and $V_{SS1}=V_{SS}=$GND are met. Specifically, $V_{DD1}$ is supposed to be larger than $V_{DD}$ by more than the absolute value of a threshold voltage of the p-channel MOS transistor in each buffer. For example, supposing $V_{DD}$ is 3.3 volts and the threshold voltage of the p-channel MOS transistor is −0.6 volts, $V_{DD1}>$3.9 volts. A power supply voltage $V_{DD1}$ supplied to the p-channel MOS transistor of each buffer is larger than a power supply voltage $V_{DD}$ supplied to a preceding inverter. Accordingly, even if an input signal at such a level as turning the p-channel MOS transistor OFF has been applied to the input of a buffer, the p-channel MOS transistor of the buffer is still kept ON and a certain amount of current continues to flow therethrough. Thus, if an input signal DO1 shown in FIG. 9B has been applied from the output of an $(x+1)^{th}$-stage inverter to the input of an associated buffer, then an output signal DO2 with a greater amplitude between $V_{DD1}$ (>$V_{DD}$) and a level higher than GND appears at the output of the buffer. If such an output signal DO2 is transmitted from the buffer to the gate electrodes of the transfer gate 4 and the reset transistor 7 within an associated pixel, potentials such as those shown in FIG. 7 are formed on the surface of the semiconductor substrate even in the charge storage mode. As a result, blooming can be suppressed in the charge storage mode. In addition, the levels of control signals, applied to respective gate electrodes of the reset transistor 7 and the transfer gate 4 to turn these transistors 7 and 4 ON, can be advantageously increased.

Figure 12:
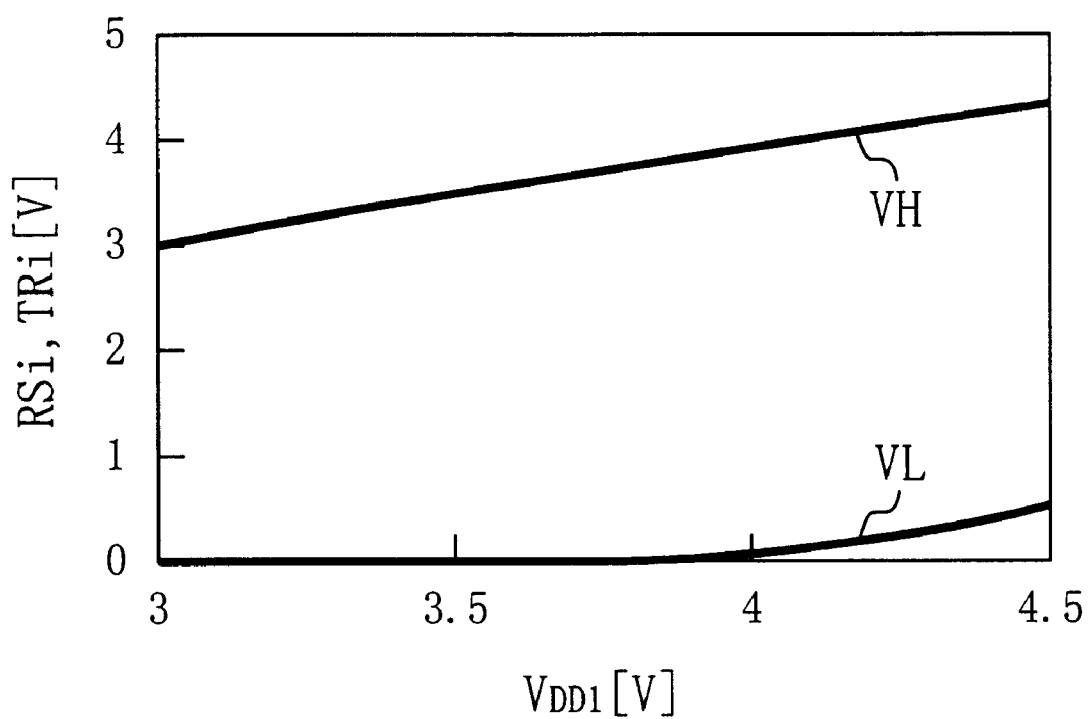
FIG. 12 is a graph illustrating how the levels of signals RSi and TRi output from the row selector in the solid-state imaging device of the second embodiment vary with that of the input signal DO1.

FIG. 12 illustrates how the level of an output signal DO2 varies with that of $V_{DD1}$. In FIG. 12, VH indicates the higher level of the output signal DO2, while VL indicates the lower level of the output signal DO2. The higher-level (VH) output signal DO2 of a buffer is applied as control signals RSi and TRi to respective gate electrodes of the reset transistor 7 and the transfer gate 4 at respective predetermined times. During the intervals other than the interval in which the higher-level output signal DO2 is being applied, the lower-level (VL) output signal DO2 is applied to respective gate electrodes of the reset transistor 7 and the transfer gate 4. As a result, current continues to flow through the reset transistor 7 and the transfer gate 4, through the amount thereof is small.

EMBODIMENT 3

Figure 10A:
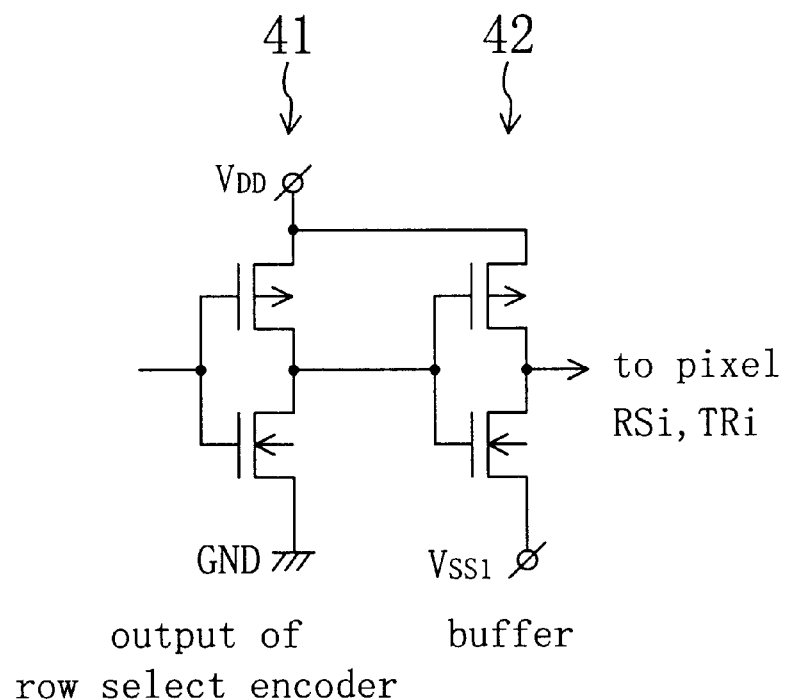
FIG. 10A is a circuit diagram illustrating a configuration of a principal section, associated with the selection of the $i^{th}$ row, of a row selector in a solid-state imaging device according to a third embodiment of the present invention.
Figure 10B:
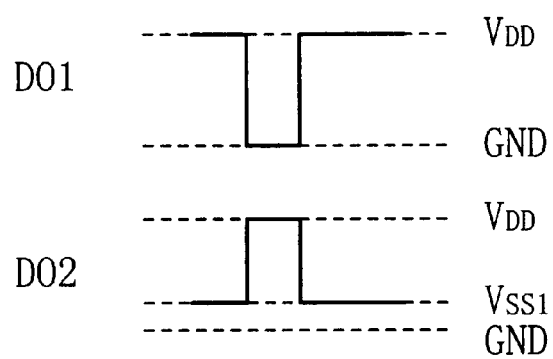
FIG. 10B is a waveform chart illustrating a signal DO1 input from the $(x+1)^{th}$-stage inverter to the input of a buffer in the row selector and a signal DO2 output through the output of the buffer.

Next, a solid-state imaging device according to a third embodiment of the present invention will be described with reference to FIGS. 10A and 10B. FIG. 10A illustrates a configuration of a principal section, associated with the selection of an with row, of the row selector, where i is an arbitrary integer in the range from 1 to N, both inclusive, and N is an integer equal to or larger than 2.

Each buffer and an associated $(X+1)^{th}$-stage inverter of this embodiment also have the same configurations as the counterparts described in the second embodiment. This embodiment is characterized in that the relationships $V_{DD1}=V_{DD}$ and $V_{SS1}>V_{SS}=GND$ are met. Thus, if an input signal DO1 shown in FIG. 10B has been applied from the output of an $(x+1)^{th}$-stage inverter to the input of an associated buffer, then an output signal DO2 with an amplitude between $V_{DD}$ and a level higher than GND appears at the output of the buffer. If such an output signal DO2 is transmitted from each buffer to the gate electrodes of the transfer gate 4 and the reset transistor 7 within an associated pixel, potentials such as those shown in FIG. 7 are formed on the surface of the semiconductor substrate even in the charge storage mode. As a result, blooming can be suppressed in the charge storage mode.

EMBODIMENT 4

Next, a solid-state imaging device according to a fourth embodiment of the present invention will be described with reference to FIGS. 9A and 11. Each buffer and an associated $(x+1)^{th}$-stage inverter of this embodiment also have the same configurations as the counterparts described in the second embodiment.

Figure 11:
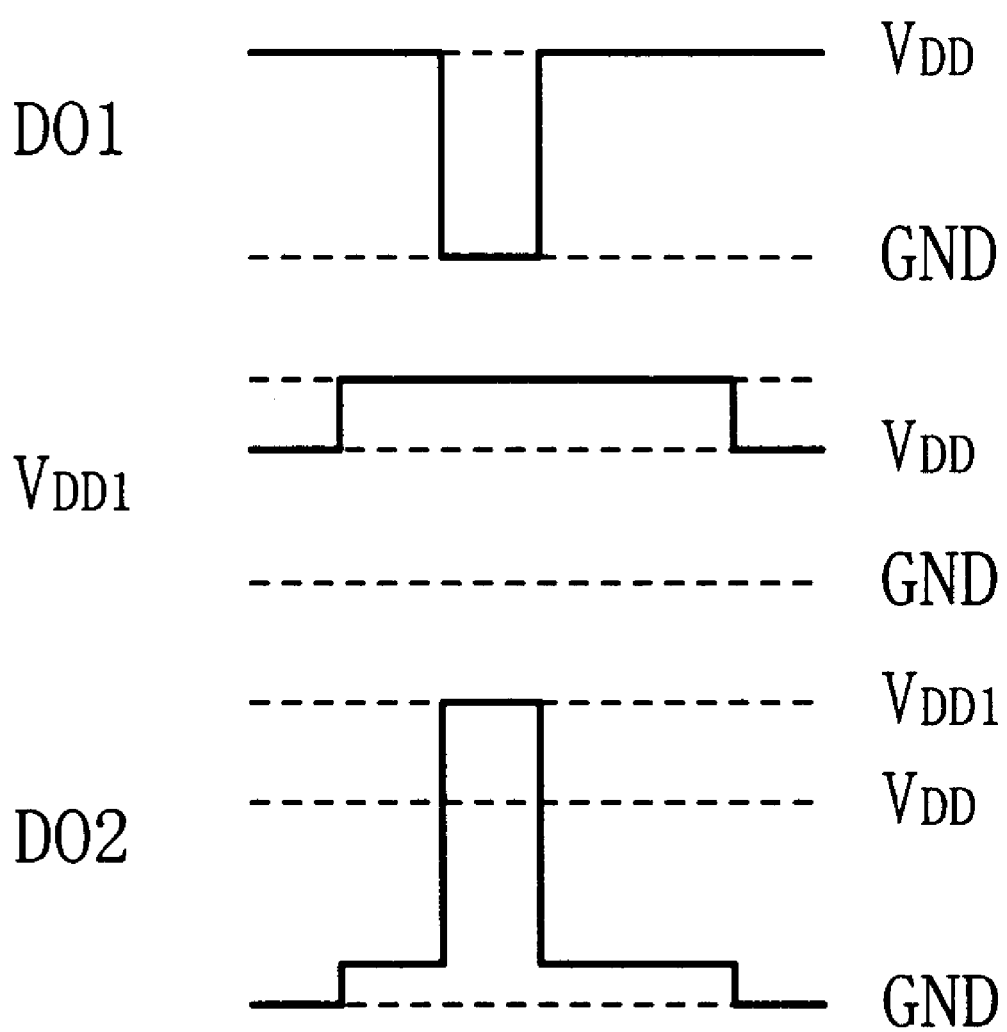
FIG. 11 is a waveform chart illustrating a signal DO1 input from the $(x+1)^{th}$-stage inverter to the input of a buffer in a row selector of a solid-state imaging device according to a fourth embodiment of the present invention, and a signal DO2 output through the output of the buffer.

In this embodiment, the potential level of $V_{DD1}$ is varied like pulses as shown in FIG. 11 such that the relationships $V_{DD1}=V_{DD}$ and $V_{SS1}=V_{SS}=GND$ are met during a predetermined interval and that the relationships $V_{DD1}>V_{DD}$ and $V_{SS1}=V_{SS}=GND$ are met during the other intervals. As a result, only during a relatively short predetermined interval (e.g., a horizontal blanking interval) included in an interval during which an input signal at such a level as turning a p-channel MOS transistor OFF is being applied to the input of an associated buffer, a certain amount of current (on the order of several hundreds microamperes to several tens milliamperes) flows through the p-channel MOS transistor. Accordingly, if an input signal DO1 shown in FIG. 11 has been applied from the output of an $(X+1)^{th}$-stage inverter to the input of an associated buffer, then an output signal DO2 with an amplitude between $V_{DD1}$ ($>V_{DD}$) and a level higher than GND appears at the output of the buffer. If such an output signal DO2 is transmitted from the buffer to the gate electrodes of the transfer gate 4 and the reset transistor 7 within an associated pixel, potentials such as those shown in FIG. 7 are formed on the surface of the semiconductor substrate even in the charge storage mode. As a result, blooming can be suppressed in the charge storage mode. In addition, the levels of control signals, applied to respective gate electrodes of the reset transistor 7 and the transfer gate 4 to turn these transistors 7 and 4 ON, can be advantageously increased. Furthermore, according to the fourth embodiment, the power consumption can be reduced as compared with the first and third embodiments. This is because $V_{DD1}>V_{DD}$ is met only during a limited interval.

Figure 13:
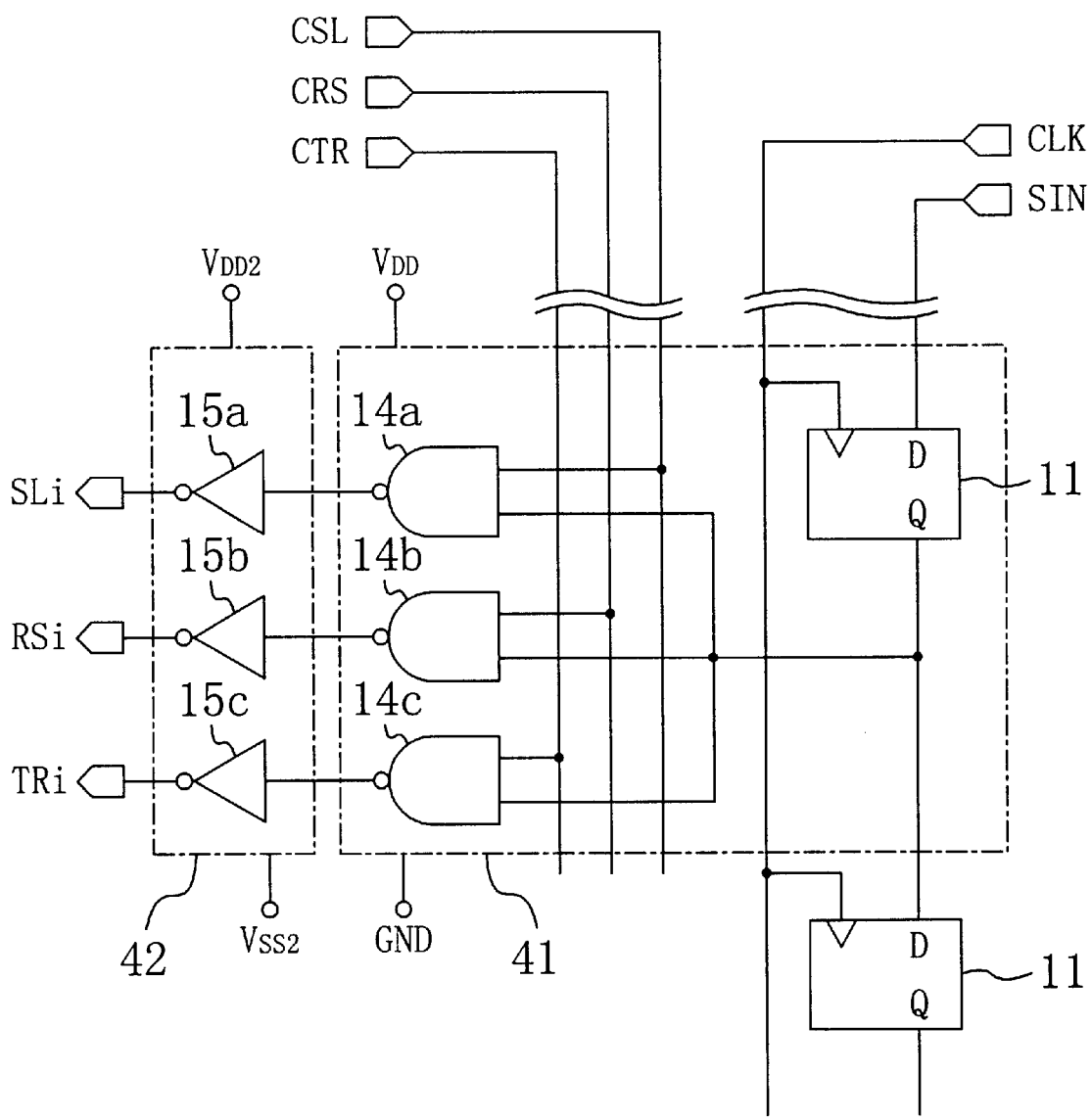
FIG. 13 is a circuit diagram illustrating an exemplary internal configuration of a principal section, associated with the selection of the $i^{th}$ row, of a row selector preferably used in the solid-state imaging device of the present invention.

FIG. 13 illustrates exemplary configurations of the row select encoder 41 and the buffer circuit 42.

The buffer circuit 42 includes three last-stage inverters 15a, 15b and 15c per row, from which three types of control signals, namely, select signal SLi, reset signal RSi and transfer signal TRi, are respectively output. The row select encoder 41 includes three two-input NAND gates 14a, 14b and 14c per row, which are connected to an associated set of last-stage inverters 15a through 15c. Each of the two-input NAND gates 14a through 14c is composed of a plurality of inverters.

The row select encoder 41 includes a shift register 11, which receives the clock signal CLK and a start pulse SIN and operates in synchronism with the clock signal CLK. When a logically high signal is output from part of the shift register 11 associated with the $i^{th}$ row, the $i^{th}$ row is selected. The signal, output from that part of the shift register 11 associated with the $i^{th}$ row is supplied to one of the two input terminals in each of the three two-input NAND gates 14a through 14c belonging to the $i^{th}$ row. The other input terminals of these three two-input NAND gates 14a through 14c receive the select sync signal CSL, the reset sync signal CRS and the transfer sync signal CTR, respectively.

When the select sync signal CSL becomes logically high while the logical high signal is being output from the part of the shift register 11 associated with the $i^{th}$ row, the output of the two-input NAND gate 14a is supplied as the select signal SLi via the last-stage inverter 15a. Also, when the reset sync signal CRS becomes logically high while the logical high signal is being output from the part of the shift register 11 associated with the $i^{th}$ row, the output of the two-input NAND gate 14b is supplied as the reset signal RSi via the inverter 15b. Furthermore, when the transfer sync signal CTR becomes logically high while the logical high signal is being output from the part of the shift register 11 associated with the $i^{th}$ row, the output of the two-input NAND gate 14c is supplied as the transfer signal TRi via the inverter 15c.

Figure 14:
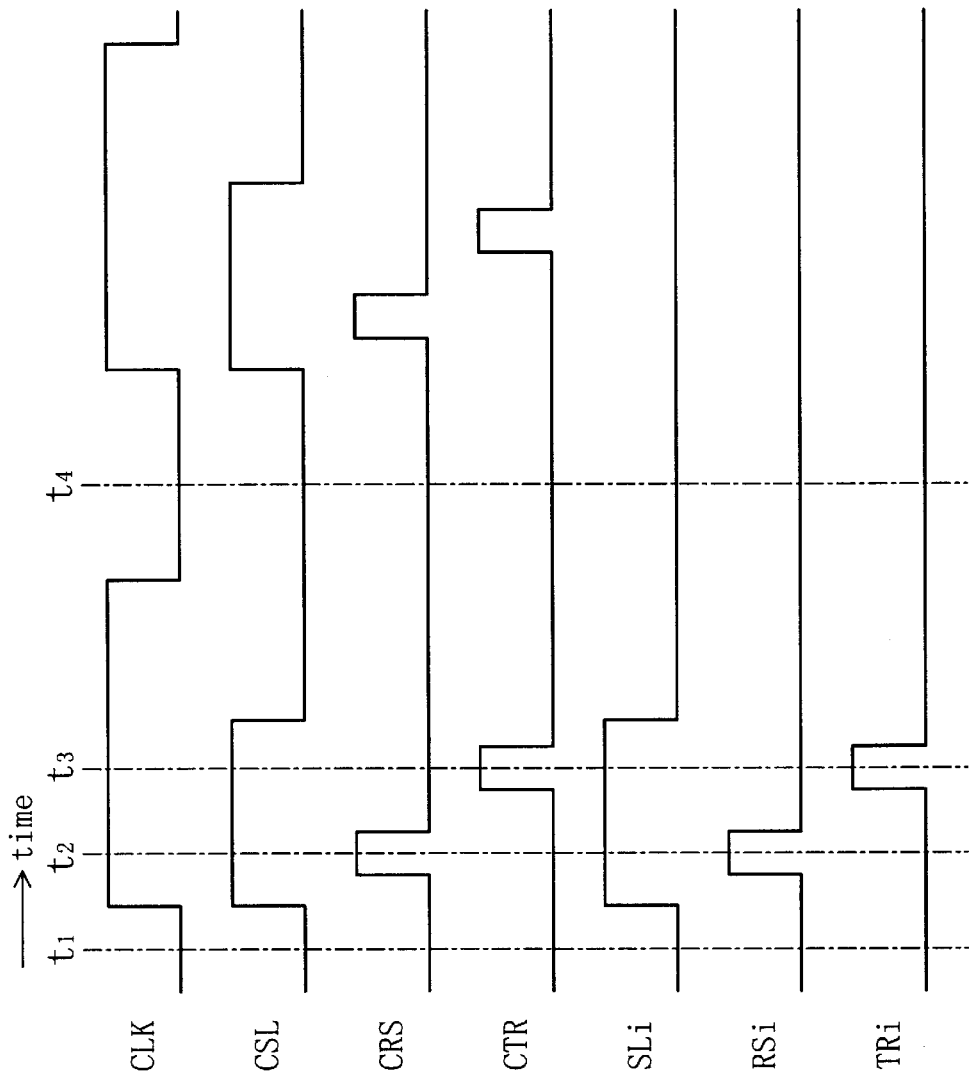
FIG. 14 is a timing diagram illustrating respective waveforms of clock CLK, select sync CSL, reset sync CRS and transfer sync signals CTR, which are all input to the row selector in FIG. 13, and those of select SLi, reset RSi and transfer signals TRi, which are all output from the row selector.

Next, a timing relationship among these signals will be described with reference to FIG. 14.

First, at a time t1, the clock signal CLK, select sync signal CSL, reset sync signal CRS and transfer sync signal CTR are all logically low. At this point in time, the select signal SLi, reset signal RSi and transfer signal TRi are all logically low, too. Accordingly, the switching transistor 6b, reset transistor 7 and transfer gate 4 are all OFF. That is to say, the mode of operation in this state is "charge storage" shown in FIG. 3. However, according to the first through third embodiments of the present invention, the potential level VL at the output of each buffer is positively biased even in the logically low state (see FIGS. 8B, 9B and 10B).

Next, at a time t2, the clock signal CLK, select sync signal CSL and reset sync signal CRS all have changed into logically high, whereas the transfer sync signal CTR remains logically low. At this point in time, the select signal SLi and the reset signal RSi both have changed into logically high, but the transfer signal TRi remains logically low. Accordingly, although the switching transistor 6b and the reset transistor 7 have turned ON, the transfer gate 4 remains OFF. The mode of operation in such a state corresponds to "detection portion reset" shown in FIG. 4.

Then, at a time t3, the clock signal CLK, select sync signal CSL and transfer sync signal CTR all remain logically high, whereas the reset sync signal CRS has changed into logically low. At this point in time, the select signal SLi and the transfer signal TRi are both logically high, but the reset signal RSi has changed into logically low. Accordingly, although the switching transistor 6b and the transfer gate 4 are ON, the reset transistor 7 is OFF. The mode of operation in such a state corresponds to "signal readout" shown in FIG. 5.

Subsequently, at a time t4, the clock signal CLK, select sync signal CSL, reset sync signal CRS and transfer sync signal CTR are all logically low. At this point in time, the select signal SLi, reset signal RSi and transfer signal TRi are all logically low, too. Accordingly, the switching transistor 6b, reset transistor 7 and transfer gate 4 are all OFF. However, since the reset signal RSi and the transfer signal TRi have been positively biased, channel potentials in the reset transistor 7 and the transfer gate 4 decrease as shown in FIG. 7. Thus, the charges, which have been excessively created in the photoelectric transducer 3, do not overflow into an adjacent pixel, but flow toward the first power supply via the transfer gate 4 and the reset transistor 7. As a result, the generation of blooming can be suppressed.

Figure 15:
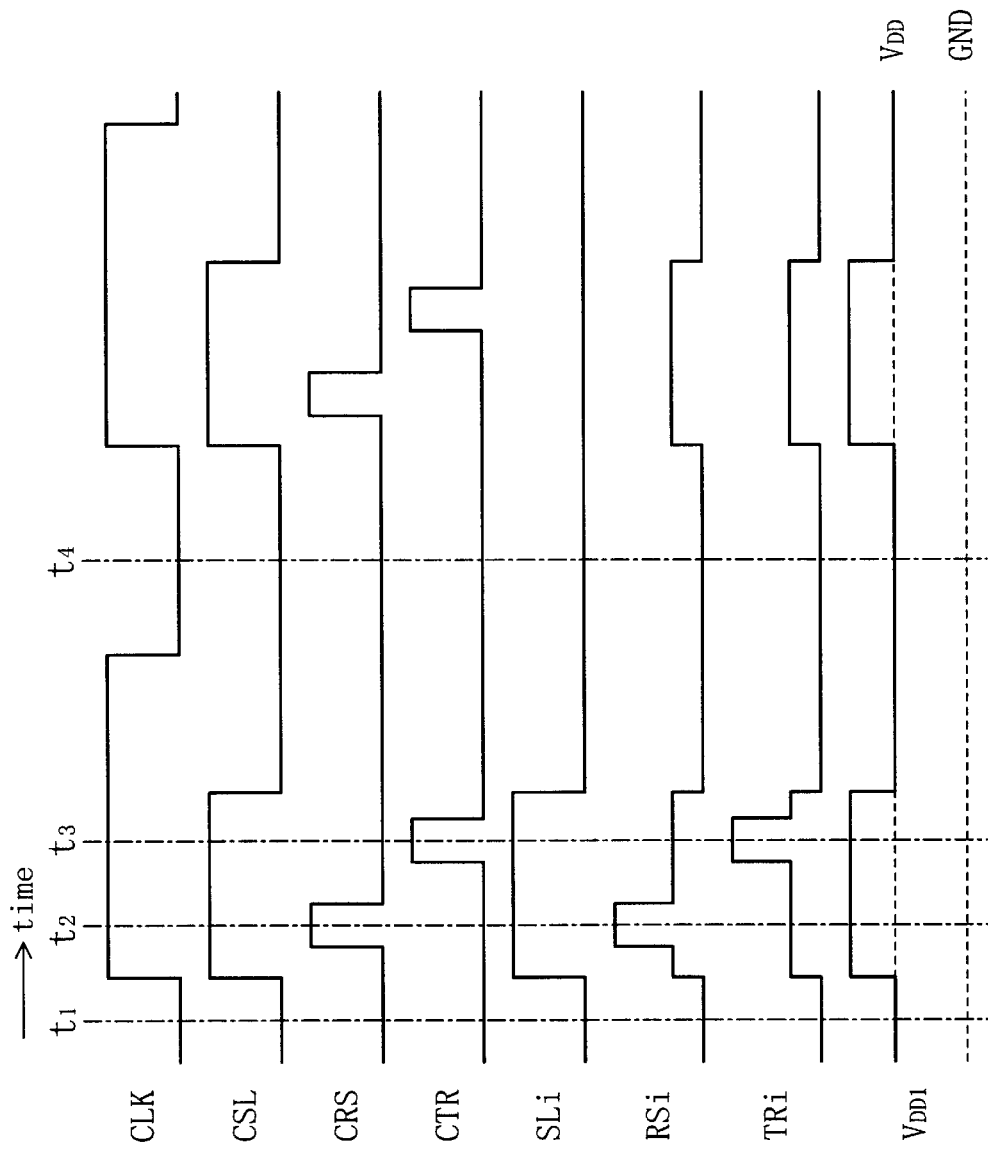
FIG. 15 is a timing diagram illustrating respective waveforms of clock CLK, select sync CSL, reset sync CRS and transfer sync signals CTR, which are all input to the row selector in FIG. 13, and those of select SLi, reset RSi and transfer signals TRi, which are all output from the row selector in the solid-state imaging device of the fourth embodiment.

This timing relationship is applicable to any of the first through third embodiments. Next, a timing relationship among respective signals according to the fourth embodiment will be described with reference to FIG. 15.

First, at a time t1, the clock signal CLK, select sync signal CSL, reset sync signal CRS and transfer sync signal CTR are all logically low. At this point in time, the select signal SLi, reset signal RSi and transfer signal TRi are all logically low, too. Accordingly, the switching transistor 6b, reset transistor 7 and transfer gate 4 are all OFF. That is to say, the mode of operation in this state is "charge storage" shown in FIG. 3. However, according to the first through third embodiments of the present invention, the potential level VL at the output of each buffer is positively biased even in the logically low state (see FIGS. 8B, 9B and 10B).

Next, at a time t2, the clock signal CLK, select sync signal CSL and reset sync signal CRS all have changed into logically high, whereas the transfer sync signal CTR remains logically low. At this point in time, the select signal SLi and the reset signal RSi both have changed into logically high, but the transfer signal TRi remains logically low. Also, in synchronism with the leading edge of the select sync signal CSL, the potential level of $V_{DD1}$ increases to exceed that of $V_{DD}$. Accordingly, the switching transistor 6b and the reset transistor 7 have turned ON, and the potential $V_{DD1}$, higher than $V_{DD}$, is applied to the gate electrode of the reset transistor 7. Although the transfer gate 4 remains OFF, a signal applied to the gate electrode of the transfer gate 4 has been biased.

Then, at a time t3, the clock signal CLK, select sync signal CSL and transfer sync signal CTR are all logically high, whereas the reset sync signal CRS has changed into logically low. At this point in time, the select signal SLi and the transfer signal TRi are both logically high, but the reset signal RSi has changed into logically low. Accordingly, although the switching transistor 6b and the transfer gate 4 are ON, the reset transistor 7 is OFF. Nevertheless, a signal applied to the gate electrode of the reset transistor 7 has been biased.

Subsequently, at a time t4, the clock signal CLK, select sync signal CSL, reset sync signal CRS and transfer sync signal CTR are all logically low. At this point in time, the select signal SLi, reset signal RSi and transfer signal TRi are all logically low, too. Accordingly, the switching transistor 6b, reset transistor 7 and transfer gate 4 are all OFF. In addition, since the reset signal RSi and the transfer signal TRi have not been positively biased, no current flows through the inverter. As a result, increase in power dissipation can be suppressed.

In the fourth embodiment, the reset signal RSi and the transfer signal TRi are positively biased for a certain interval (e.g., a horizontal blanking interval). Thus, during this interval, channel potentials in the reset transistor 7 and the transfer gate 4 decrease as shown in FIG. 7. Accordingly, the charges, which have been excessively created in the photoelectric transducer 3, do not overflow into an adjacent pixel, but flow toward the first power supply via the transfer gate 4 and the reset transistor 7. As a result, the generation of blooming can be suppressed.

In the foregoing first through fourth embodiments, each pixel 1 includes the transfer gate 4. Hereinafter, an embodiment where each pixel includes no transfer gate will be described.

Figure 16:
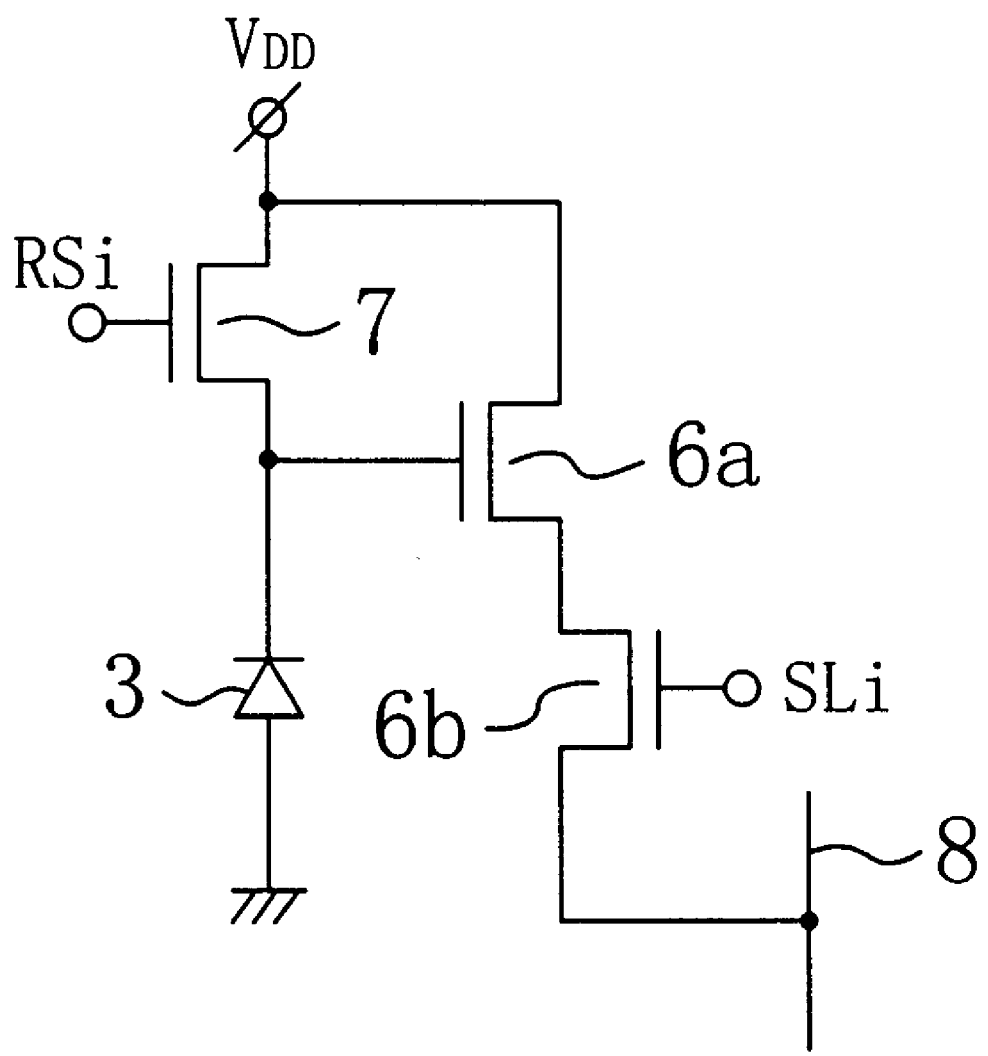
FIG. 16 is a circuit diagram illustrating a configuration of each pixel having no transfer gate according to another exemplary embodiment of the present invention.

FIG. 16 illustrates a configuration of each pixel. As shown in FIG. 16, each pixel includes a photoelectric transducer 3 for converting incoming light into electric charges and storing the charges therein. The photoelectric transducer 3 may be implemented as a photodiode, for example. Each pixel further includes an MOS transistor 6a, functioning as an amplifier for sensing a variation in potential in the photoelectric transducer 3. The gate electrode of the MOS transistor 6a is connected to the photoelectric transducer 3. The drain the transistor 6a is connected to a first power supply $V_{DD}$. And the source of the transistor 6a is connected to a vertical signal output line 8 via a switching transistor 6b within the pixel. The current drivability of the MOS transistor 6a is dependent on a potential at the gate electrode thereof, i.e., a potential in the photoelectric transducer 3. Responsive to a control signal SLi received at the gate electrode thereof, the switching transistor 6b turns ON/OFF. While the switching transistor 6b is ON, current flows from the first power supply into a load element (e.g., a load resistor (not shown)) via the MOS transistor 6a, the switching transistor 6b and the vertical signal output line 8. In this embodiment, a source follower circuit (SFC) is made up of the MOS transistor 6a and the load element. Accordingly, a signal potential with a level corresponding to the potential in the photoelectric transducer 3 appears on the vertical signal output line 8. And this signal potential is output as a pixel signal by a selected column driver 22.

Each pixel 1 further includes a reset transistor 7 between the first power supply $V_{DD}$ and the photoelectric transducer 3. Responsive to a reset signal RSi received at the gate electrode thereof, the reset transistor 7 compellingly resets the potential in the photoelectric transducer 3 at the potential level of the first power supply $V_{DD}$ or the vicinity thereof. When the reset transistor 7 turns ON, charges, which have been stored in the photoelectric transducer 3, start to flow into the first power supply $V_{DD}$ via the reset transistor 7. As a result, the potential in the photoelectric transducer 3 is compellingly reset at the initial level thereof.

Figure 17:
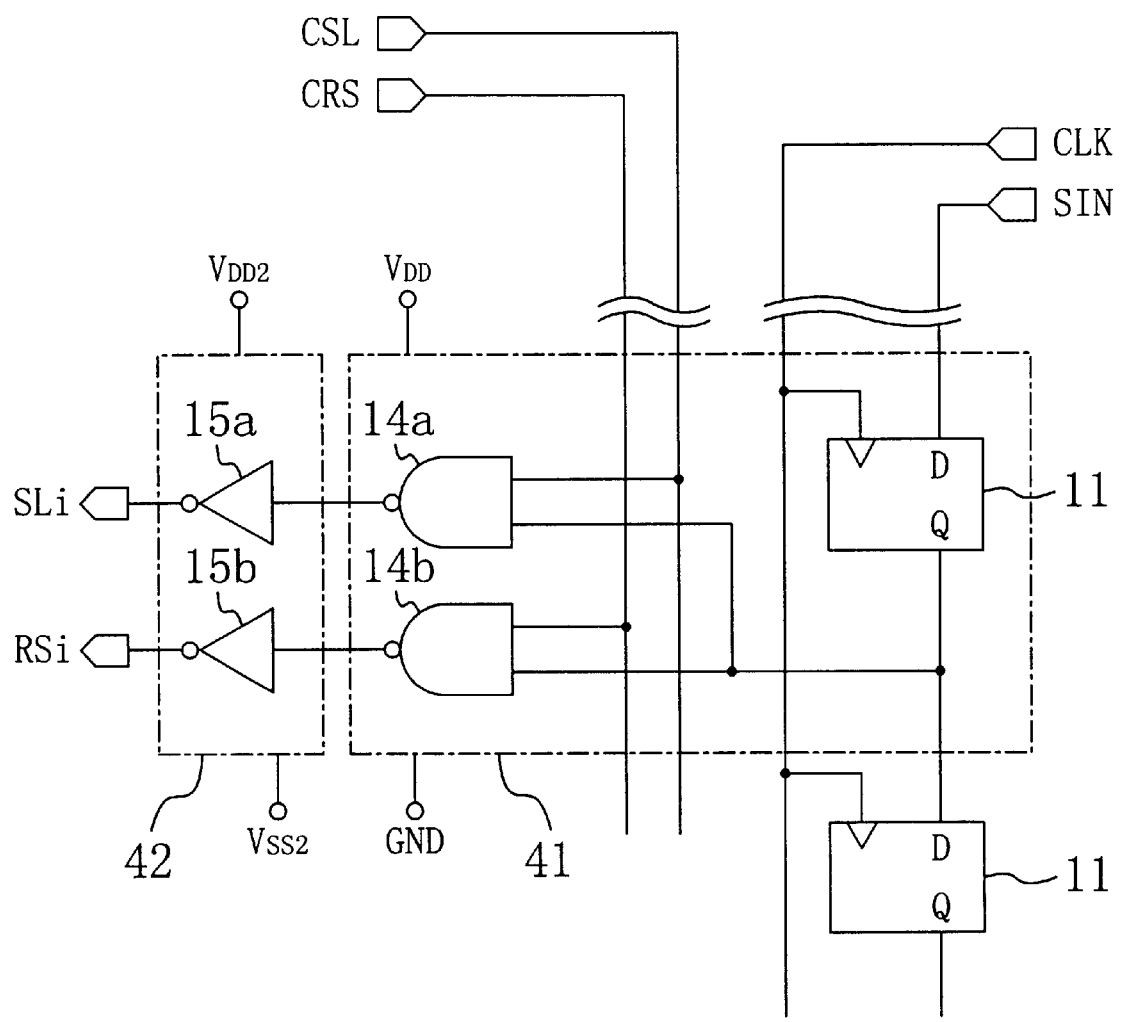
FIG. 17 is a circuit diagram illustrating a principal section of a row selector for a solid-state imaging device including the pixel shown in FIG. 16.
Figure 18A:
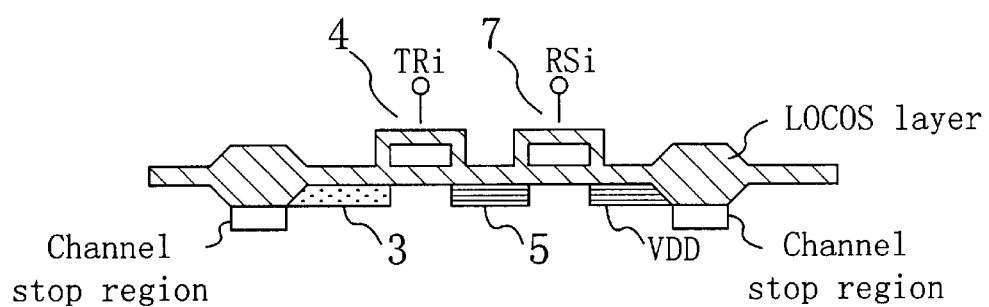
FIG. 18A is a cross-sectional view illustrating a single pixel portion, where photodiodes and transistors are formed, near the surface of a semiconductor substrate.
Figure 18B:
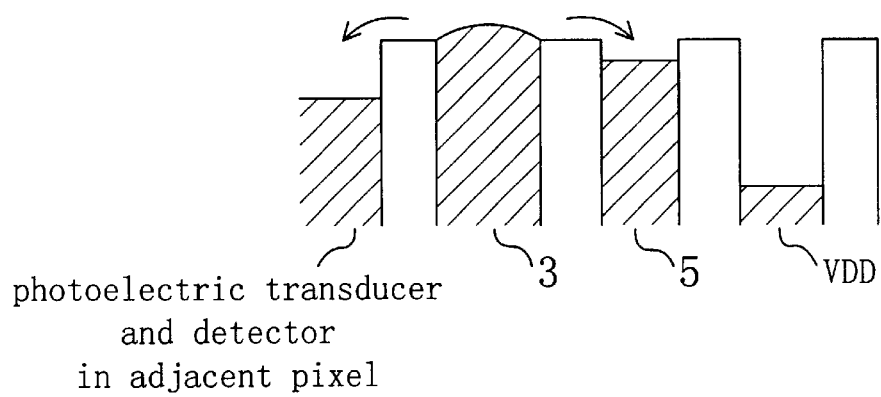
FIG. 18B is a schematic representation illustrating distribution of potentials in that part.

FIG. 17 illustrates a principal section of a row selector for a device including the pixel shown in FIG. 16.

A buffer circuit 42 includes two last-stage inverters 15a and 15b per row, from which two types of control signals, namely, select signal SLi and reset signal RSi, are respectively output. A row select encoder 41 includes a pair of two-input NAND gates 14a and 14b per row, which are connected to an associated pair of last-stage inverters 15a and 15b. Each of the two-input NAND gates 14a and 14b is composed of a plurality of inverters.

The row select encoder 41 includes a shift register 11, which receives the clock signal CLK and a start pulse SIN and operates in synchronism with the clock signal CLK. When a logically high signal is output from part of the shift register 11 associated with the $i^{th}$ row, the $i^{th}$ row is selected. The signal, output from that part of the shift register 11 associated with the $i^{th}$ row, is supplied to one of the two input terminals in each of the two-input NAND gates 14a and 14b belonging to the $i^{th}$ row. The other input terminals of the two-input NAND gates 14a and 14b receive the select sync signal CSL and the reset sync signal CRS, respectively.

When the select sync signal CSL becomes logically high while the logical high signal is being output from the part of the shift register 11 associated with the $i^{th}$ row, the output of the two-input NAND gate 14a is supplied as the select signal SLi via the inverter 15a. On the other hand, when the reset sync signal CRS becomes logically high while the logical high signal is being output from the part of the shift register 11 associated with the $i^{th}$ row, the output of the two-input NAND gate 14b is supplied as the reset signal RSi via the inverter 15b.

The device with such a configuration also operates like the devices of the first through fourth embodiments and can attain similar effects. In this embodiment, however, since no transfer gate is provided, an excessive quantity of charges, created in the photoelectric transducer 3, flow into the first power supply $V_{DD}$ via the reset transistor 7. Accordingly, the overflow of the charges into an adjacent pixel can be prevented or at least drastically reduced, thus suppressing the generation of blooming.

What is claimed is:

1. A solid-state imaging device comprising:

an imaging area including a plurality of pixels arranged in columns and rows; and peripheral circuitry for selecting at least one of the pixels, wherein each said pixel includes:
   a photoelectric transducer for creating electric charges by converting incoming light into electric energy and for storing the charges therein;
   means for storing the charges that have been read out from the photoelectric transducer;
   a transfer electrode, provided between the photoelectric transducer and the storage means, for reading out the charges from the photoelectric transducer to the storage means;
   an amplifier for sensing a variation in potential in the storage means; and
   a reset electrode for discharging the charges, which have been stored in the storage means, to a power supply, thereby resetting the potential in the storage means, and
   wherein the peripheral circuitry includes a selector for generating first and second control signals, the first control signal being applied to the transfer electrode to control the height of a first electrical barrier under the transfer electrode, the second control signal being applied to the reset electrode to control the height of a second electrical barrier under the reset electrode,
   wherein the selector includes a bank of multi-stage inverters operative upon the application of first and second power supply voltages thereto, the second power supply voltage being lower than the first power supply voltage, some of the inverters on the last stage generating biased output signals to be supplied as the first and second control signals, and
   wherein at least two different voltages are applied as the first power supply voltage to the bank of multi-stage inverters, the first power supply voltage applied to the last-stage inverters being higher than the first power supply voltage applied to the other inverters of the bank.

2. A solid-state imaging device comprising:

an imaging area including a plurality of pixels arranged in columns and rows; and peripheral circuitry for selecting at least one of the pixels, wherein each said pixel includes:
   a photoelectric transducer for creating electric charges by converting incoming light into electric energy and for storing the charges therein;
   an amplifier for sensing a variation in potential in the photoelectric transducer; and
   a reset electrode for discharging the charges, which have been stored in the photoelectric transducer, to a power supply, thereby resetting the potential in the photoelectric transducer, and
   wherein the peripheral circuitry includes a selector for generating a control signal to be applied to the reset electrode to control the height of an electrical barrier under the reset electrode,
   wherein the selector includes a bank of multi-stage inverters operative upon the application of first and second power supply voltages thereto, the second power supply voltage being lower than the first power supply voltage, some of the inverters on the last stage generating a biased output signal to be supplied as the control signal, and
   wherein at least two different voltages are applied as the first power supply voltage to the bank of multi-stage inverters, the first power supply voltage applied to the last-stage inverters being higher than the first power supply voltage applied to the other inverters of the bank.

3. A solid-state imaging device comprising a plurality of pixels, and peripheral circuitry for selecting at least one of the pixels, wherein each said pixel includes
   information storage for storing therein electric charges created by photoelectric conversion, and
   a reset device, responsive to a control signal, for varying the height of an electrical barrier existing between the information storage and a power supply, thereby discharging the electric charges, which have been stored in the information storage, to the power supply, and
   wherein the peripheral circuitry includes a selector for generating the control signal,
   wherein the selector includes a bank of multi-stage inverters operative upon the application of first and second power supply voltages thereto, the second power supply voltage being lower than the first power supply voltage, some of the inverters on the last stage generating a biased output to be supplied as the control signal to the reset device, and
   wherein at least two different voltages are applied as the first power supply voltage to the bank of multi-stage inverters, the first power supply voltage applied to the last-stage inverters being higher than the first power supply voltage applied to the other inverters of the bank.

4. The solid-state imaging device of claim 3, wherein the information storage includes a photoelectric transducer.

5. The solid-state imaging device of claim 3 or 4, wherein each said last-stage inverter of the selector is a CMOS inverter including an enhancement-mode n-channel MOS transistor and a depletion-mode p-channel MOS transistor.

6. A solid-state imaging device comprising
a plurality of pixels, and
peripheral circuitry for selecting at least one of the pixels, wherein each said pixel includes
information storage for storing therein electric charges created by photoelectric conversion, and
a reset device, responsive to a control signal, for varying the height of an electrical barrier existing between the information storage and a power supply, thereby discharging the electric charges, which have been stored in the information storage, to the power supply, and
wherein the peripheral circuitry includes a selector for generating the control signal,
wherein the selector includes a bank of multi-stage inverters operative upon the application of first and second power supply voltages thereto, the second power supply voltage being lower than the first power supply voltage, some of the inverters on the last stage generating a biased output to be supplied as the control signal to the reset device, and
wherein the first power supply voltage applied to the last-stage inverters is higher than a third power supply voltage applied to the other inverters of the bank during a selected interval only.

7. The solid-state imaging device of claim 6, wherein the selected interval is included in a horizontal blanking interval.

8. The solid-state imaging device of claim 3 or 4, wherein each said last-stage inverter is a CMOS inverter including n-channel and p-channel MOS transistors.

9. The solid-state imaging device of claim 4, wherein each said pixel includes a transfer electrode provided between the photoelectric transducer and the reset device, and
wherein responsive to a second control signal, the transfer electrode varies the height of an electrical barrier existing under the transfer electrode, thereby discharging the electric charges, which have been stored in the photoelectric transducer, to the power supply.

10. The solid-state imaging device of claim 9, wherein the selector includes a second bank of multi-stage inverters operative upon the application of the first and second power supply voltages thereto, a last-stage inverter belonging to the second bank generating a biased output to be supplied as the control signal to the transfer electrode.

11. The solid-state imaging device of claim 10, wherein the last-stage inverter of the second bank is a CMOS inverter including an enhancement-mode n-channel MOS transistor and a depletion-mode p-channel MOS transistor.

12. The solid-state imaging device of claim 10, wherein at least two different voltages are applied as the first power supply voltage to the second bank of multi-stage inverters, the first power supply voltage applied to the last-stage inverters of the second bank being higher than the first power supply voltage applied to the other inverters of the second bank.

13. The solid-state imaging device of claim 10, wherein at least two different voltages are applied as the second power supply voltage to the second bank of multi-stage inverters, the second power supply voltage applied to the last-stage inverters of the second bank being higher than the second power supply voltage applied to the other inverters of the second bank.

14. The solid-state imaging device of claim 10, wherein the first power supply voltage applied to the last-stage inverter of the second bank is higher than a third power supply voltage received by the other inverters of the second bank during a selected interval only.

15. The solid-state imaging device of claim 14, wherein the selected interval is included in a horizontal blanking interval.

16. A method for driving the solid-state imaging device recited in one of claims 3–5 and 6–8, the method comprising the steps of:
creating electric charges by photoelectric conversion to store the charges in the information storage; and
increasing a level of the control signal, generated by the selector, like pulses to make the reset device reset the charges in the information storage.

17. A method for driving the solid-state imaging device recited in one of claims 9 to 15, the method comprising the steps of:
creating electric charges by photoelectric conversion to store the charges in the photoelectric transducer;
increasing a level of the first control signal, generated by the selector, like pulses to make the reset device reset the charges existing between the transfer electrode and the reset device; and
increasing a level of the second control signal, generated by the selector, like pulses to transfer the charges in the photoelectric transducer to between the transfer electrode and the reset device via the transfer electrode.

* * * * *